United States Patent [19]

Arakawa et al.

[11] Patent Number: 5,539,314

[45] Date of Patent: Jul. 23, 1996

[54] RF SHIELD FOR FOUR-POST VERTICAL FIELD MAGNET USED FOR MRI

[75] Inventors: Mitsuaki Arakawa, Hillsborough; William K. M. Lu, San Francisco, both of Calif.

[73] Assignee: The Regents of the University of California, Berkeley, Calif.

[21] Appl. No.: 352,804

[22] Filed: Dec. 1, 1994

[51] Int. Cl.$^6$ .................................................. G01V 3/00
[52] U.S. Cl. ............................................ 324/318; 324/319
[58] Field of Search .................................. 324/318, 322, 324/319, 320, 307, 309; 128/653.5

[56] References Cited

U.S. PATENT DOCUMENTS

| | | | |
|---|---|---|---|
| 4,642,569 | 2/1987 | Hayes et al. | 324/318 |
| 4,879,515 | 11/1989 | Roemer et al. | 324/318 |
| 5,184,074 | 2/1993 | Kaufman et al. | 324/318 |
| 5,304,932 | 4/1994 | Carlson | 324/318 |

*Primary Examiner*—Louis M. Arana
*Attorney, Agent, or Firm*—Nixon & Vanderhye

[57] ABSTRACT

A four-post MRI system used in conjunction with a X-wing transmission coil is disclosed in which the post of the system and the upper and lower gradient coil assemblies are covered in a RF reflective material. The covering may be in applied foil such as copper or aluminum, or may be a screen of conductive metal, or may be a spray-on conductive metal.

10 Claims, 10 Drawing Sheets

RF SHIELD FOR FOUR-POST VERTICAL FIELD MAGNET USED FOR MRI

FIELD OF THE INVENTION

This invention relates to MRI systems, and more particularly, to RF shielding used in conjunction with RF transmission coils.

BACKGROUND OF THE INVENTION

Four-post magnet MRI systems are disclosed in U.S. Pat. No. 4,829,252 and advantageously provide improved access to the patient and a less enclosed environment for the patient during the MRI process.

A transmission coil that may be used in conjunction with the four-post MRI transverse magnet system to retain the open environment within the imaging volume, while reducing the power requirements for the transmission coil is disclosed in U.S. application No. 08/285,008. This transmission coil is sometimes referred to as the "X-wing coil." The disclosures of U.S. Pat. No. 4,829,252 and U.S. application No. 08/285,008, referred to above, and describing the four-post MRI system and the X-wing transmission coil, are incorporated herein by reference.

Figure 1:
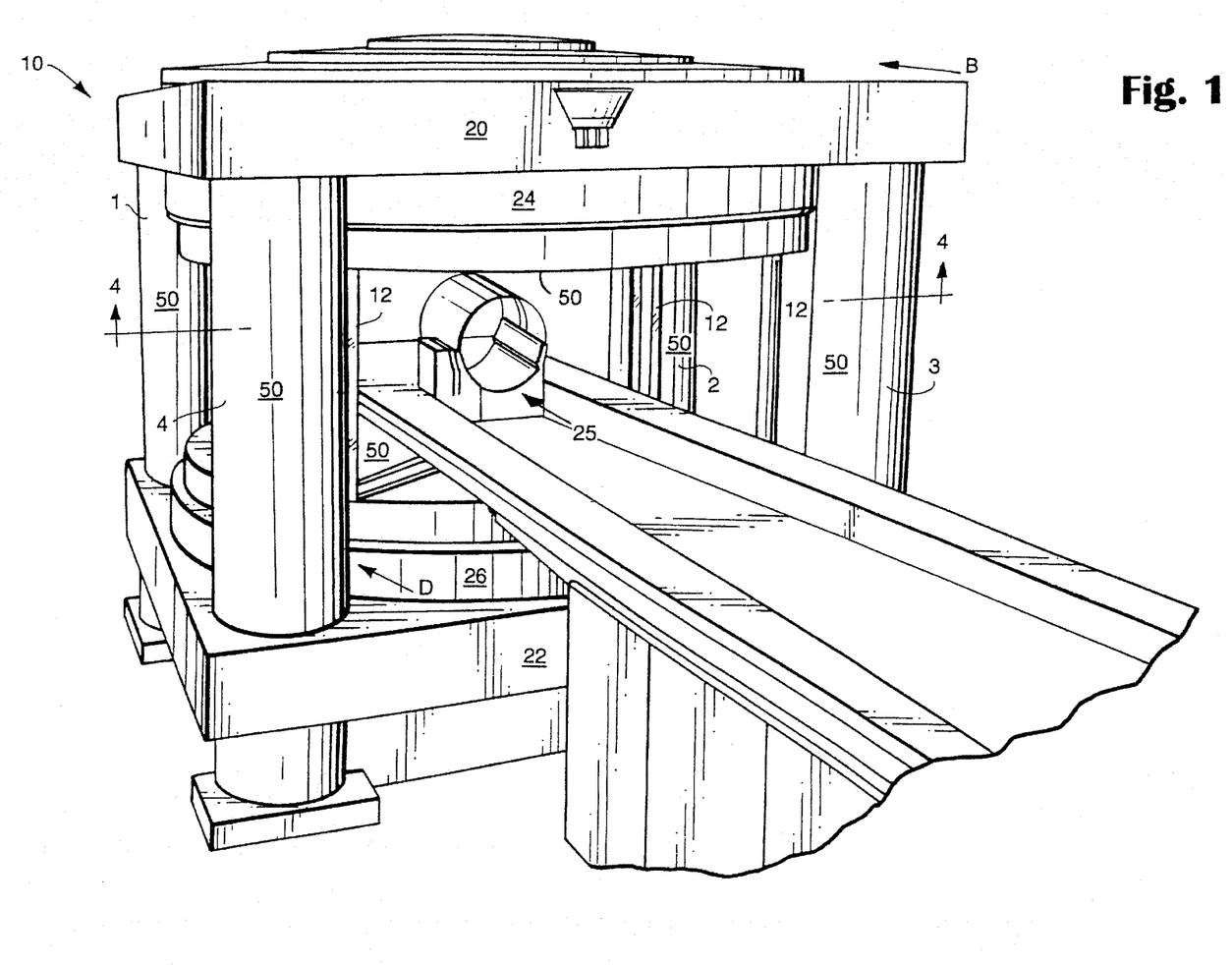
FIG. 1 is a schematic drawing of a four-post MRI system with an X-wing transmission coil and RF shielding according to the present invention.

The four-post MRI system and the X-wing coil can be seen, for example, in portions of FIG. 1. The four-post MRI assembly 10 includes posts 1–4 supporting an upper transverse magnet assembly 20 and a lower transverse assembly 22. Also included are magnet pole pieces 24 and 26 and pancake-like gradient coil assemblies 23A and 23B, respectively at the upper and lower portions of the imaging volume 25. The X-wing transmission coil 12 is near the posts 1–4 and the magnet pole pieces 24 and 26.

To maintain a high quality factor in the X-wing transmission coil, the X-wing coil should not be near any similarly shaped object outside of the image volume 25. Unfortunately, in the four-post system, the four-posts 1–4, which are close to the X-wing coils, provide a similar shape to the X-wing coils themselves. This results in inductive coupling between the X-wing transmission coil 12 and the posts 1–4. The posts 1–4 are magnetically permeable material and are RF "absorbers" during the transmission cycle of the X-wing coil, causing the X-wing coil to be lossy and specifically causing the coil Q to be substantially reduced.

The quality factor Q, that is associated with the transmission coil, is a well-known characteristic that can be described mathematically as:

$$Q = \frac{\text{Energy stored}}{\text{Energy lost/cycle}}$$

Also, the RF transmission power requirements, P, advantageously decrease with increases in coil Q according to:

$$P \alpha \frac{1}{Q}$$

Thus, a high Q in the transmission coil will provide decreases in the required RF transmission power.

Unfortunately, the X-wing transmission coil, when used in conjunction with the four-post MRI system, can result in low coil Q values. Specifically, with today's technology, transmission coil Q's of 300 or more for high field MRI systems are desirable. For low field MRI systems, transmission coil Q's of 110 and higher are desirable. An unprotected X-wing transmission coil in the four-post MRI, however, can result in substantially lower Q values.

Ideally, a four-post MRI system should use the X-wing coil to gain improvements in access to the patient, yet still obtain reductions in transmission power requirements, and improvements in the transmission coil Q.

SUMMARY OF THE INVENTION

The present invention provides an apparatus and method for incorporating the X-wing transmission coil into the four-post MRI system to obtain the benefits of improved access to the patient during the MRI process with lower relative RF transmission power requirements, yet while providing an additional benefit of improving the transmission coil quality factor. In accordance with the present invention, the imaging volumes of the four-post MRI system is substantially covered in RF reflective material and the X-wing transmission coil is aligned with the posts to maintain the improved access to the patient being imaged. The transmission coil Q is substantially improved by shielding at least the posts in the four-post MRI system and preferably shielding the posts and the upper and lower static magnet/gradient coil assemblies.

The shielding may take any form suitable for reflecting RF transmissions, and may be copper foil, aluminum foil, or conductive metal screen.

BRIEF DESCRIPTION OF THE DRAWINGS

The purpose and advantages gained by the present invention will be understood by careful study of the following detailed description of the presently preferred embodiment with particular reference to the accompanying drawings.

DETAILED DESCRIPTION OF THE PRESENTLY PREFERRED EMBODIMENT

The present invention combines the benefits of the four-post MRI system and the X-wing RF transmission coil, while improving the quality factor of the RF transmission coil. It does so by shielding the imaging volume with a material that reflects RF field. In FIG. 1, an embodiment of the present invention is shown in which the four-post MRI system 10 includes posts 1–4 supporting an upper static magnet assembly 20, an upper magnet pole piece 24, an upper gradient coil assembly 23A, a lower static magnet pole piece 26, and a lower gradient coil assembly 23B. The four-posts 1–4 and the magnet pole pieces 24 and 26 define an imaging volume 25 within which a patient may be inserted for MRI procedures.

The MRI procedure requires an RF transmission coil 12, which is used in known fashion to cause nuclei in the patient to rotate 90 or 180 degrees out of phase with the magnetic field generated by the static magnets 20 and 22. As is also known, an RF receiving coil is placed near the body being imaged to detect RF signals that are generated by these rotated nuclei after the RF transmission signals are ceased.

The particular transmission coil 12 shown in FIG. 1 is the "X-wing" type transmission coil consisting of strips of conductive material forming two loops between opposing pairs of posts 1/3 and 2/4. As can be seen in FIG. 1, the four-post MRI system, together with the X-wing transmission coil 12 provide improved access to the patient within the imaging volume 25 during the MRI process.

Unfortunately, the quality factor Q of the transmission coil 12 can be unacceptably low due to inductive coupling that occurs between the transmission coil 12 and the magnetically permeable posts 1–4 that are near them.

Figure 2:
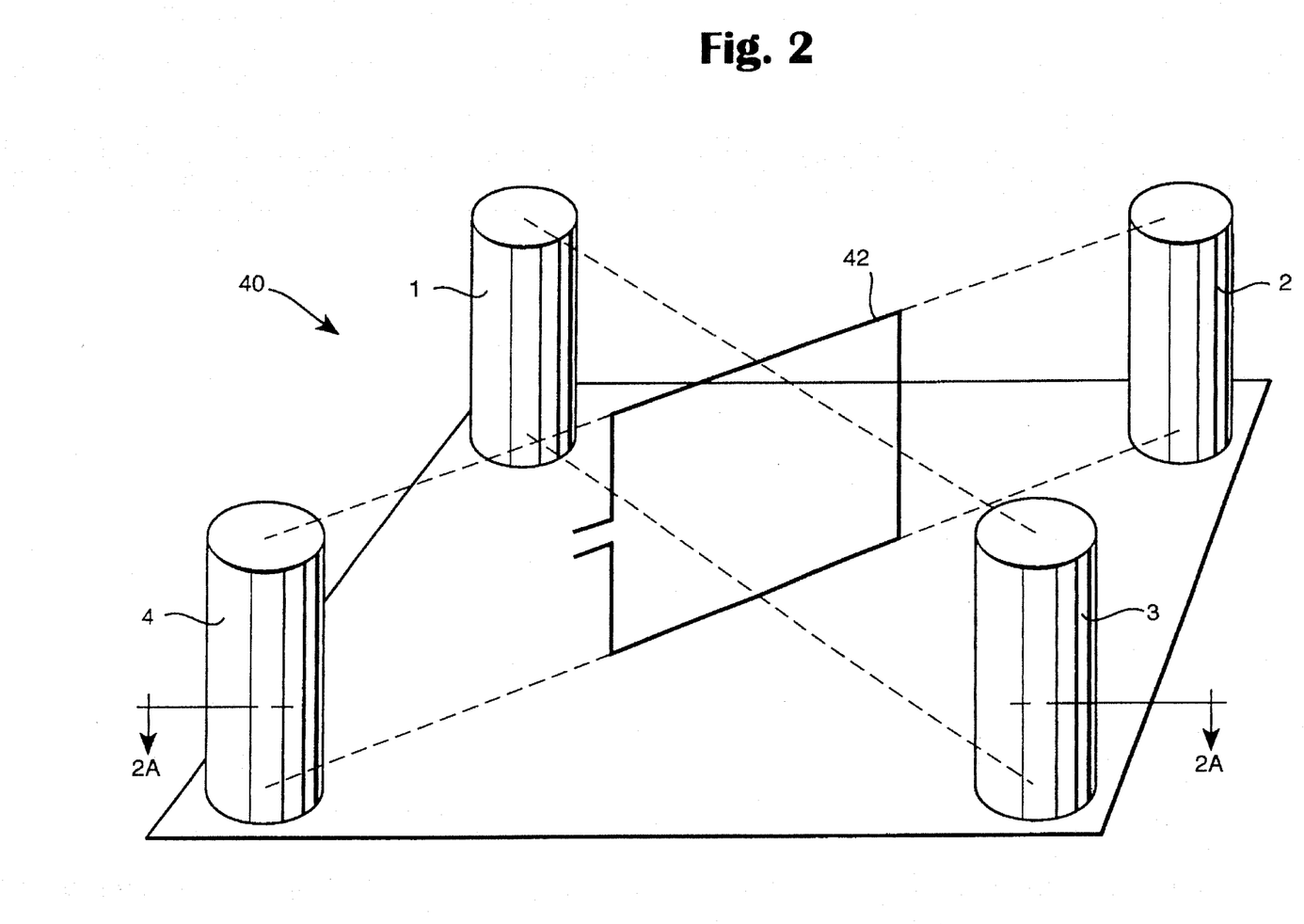
FIG. 2 is a schematic drawing of one loop of the X-wing coil arranged in alignment with the four posts of the MRI system.
Figure 2A:
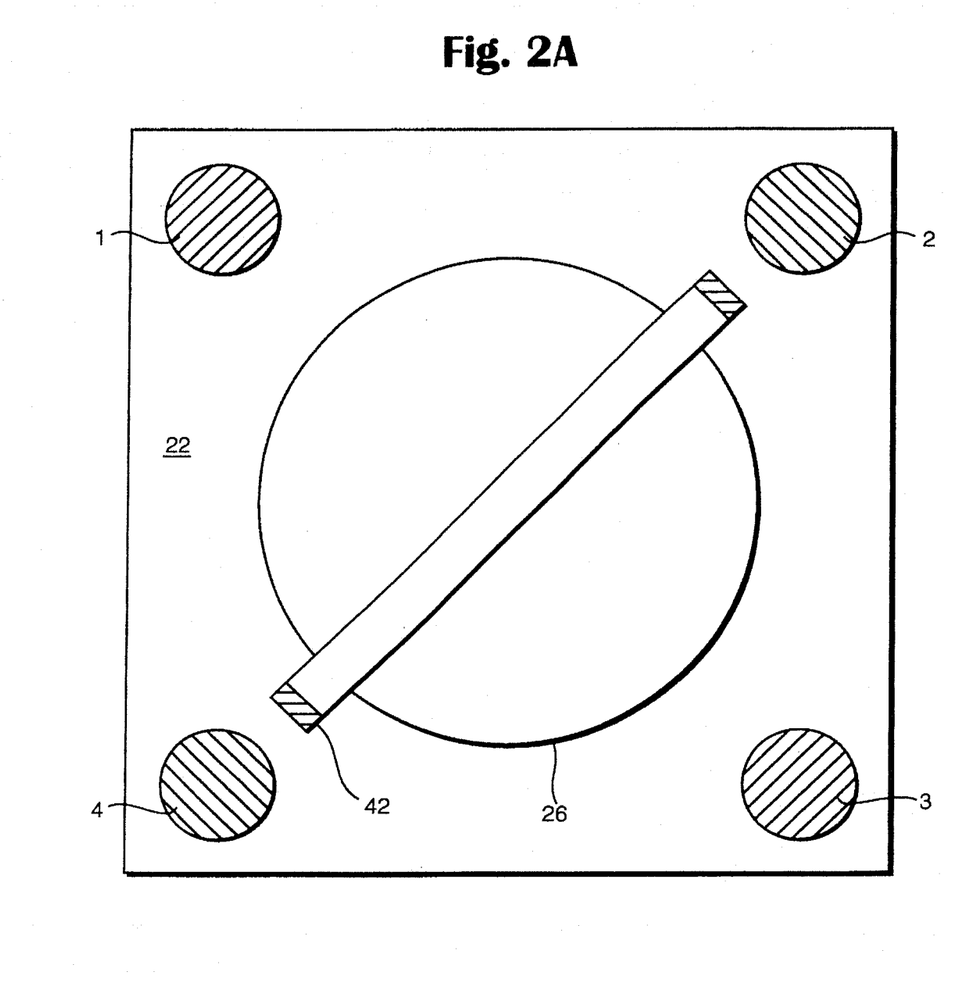
FIG. 2A is a cross-sectional view taken along the line 2A—2A in FIG. 2.

To illustrate this, a test was performed with one of the two transmission coil loops that ordinarily form the X-wing coils. In this case, the loop was arranged in the MRI system 40 as shown in FIGS. 2 and 2A. The tests were conducted with a 19.5 inch by 59 inch transmission coil loop used in an MRI system operating at 15 MHz. The distance from the posts and 4, for example, to the nearest respective edges of the rectangular loop 42 was approximately 6⅞ inches and the distance from the upper and lower gradient coil assemblies 24 and 26 to their nearest respective sides of the rectangular loop 42 was ¾–1¼ inch.

The posts 1–4 were magnetically permeable material and, as expected, inductively coupled with the transmission coil 42 causing high losses. With the loop 42 in the position shown in FIGS. 2 and 2A and with the conditions discussed above, the coil Q was measured as 35. This value is considered too low for low-, mid-, and high-field MRI systems.

Figure 2B:
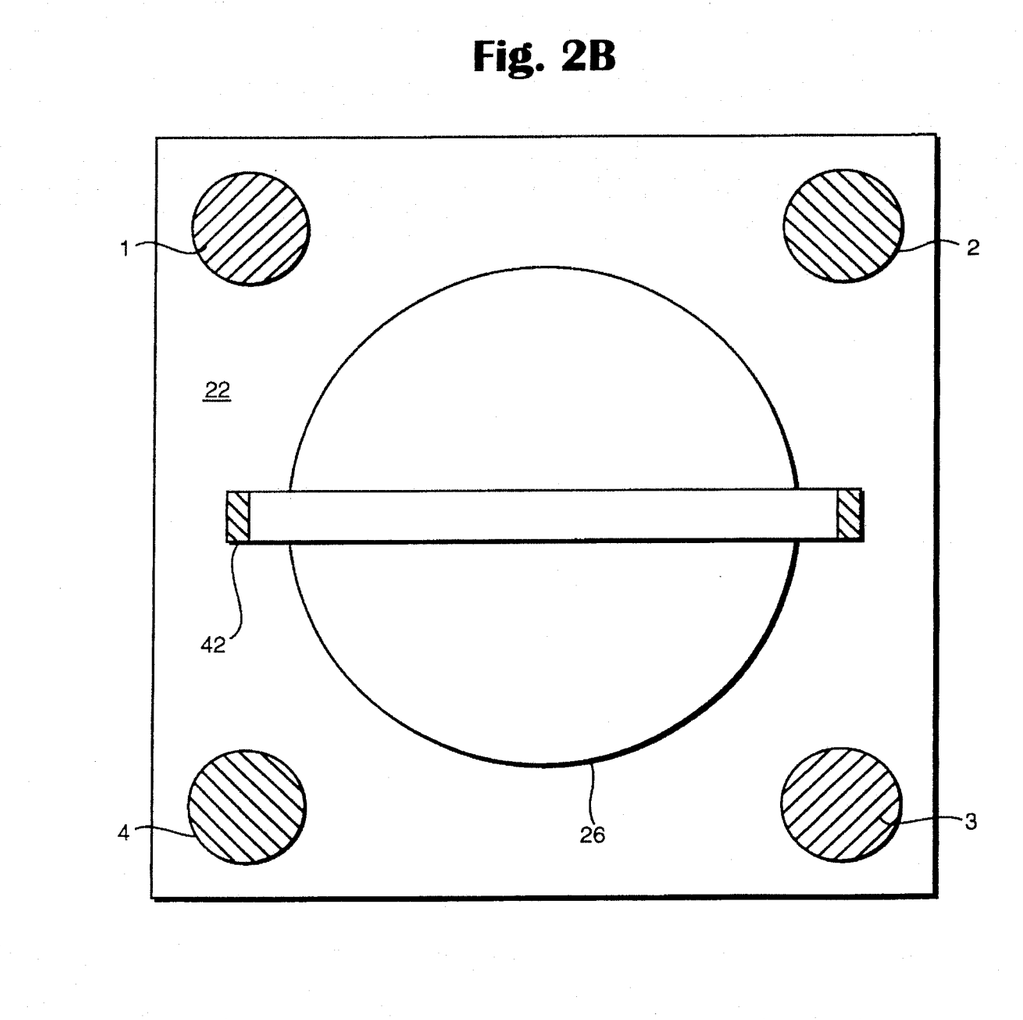
FIG. 2B is a modification of the cross-sectional view of FIG. 2A where the X-wing coil is rotated 45 degrees out of alignment with its position in FIG. 2A.
Figure 3:
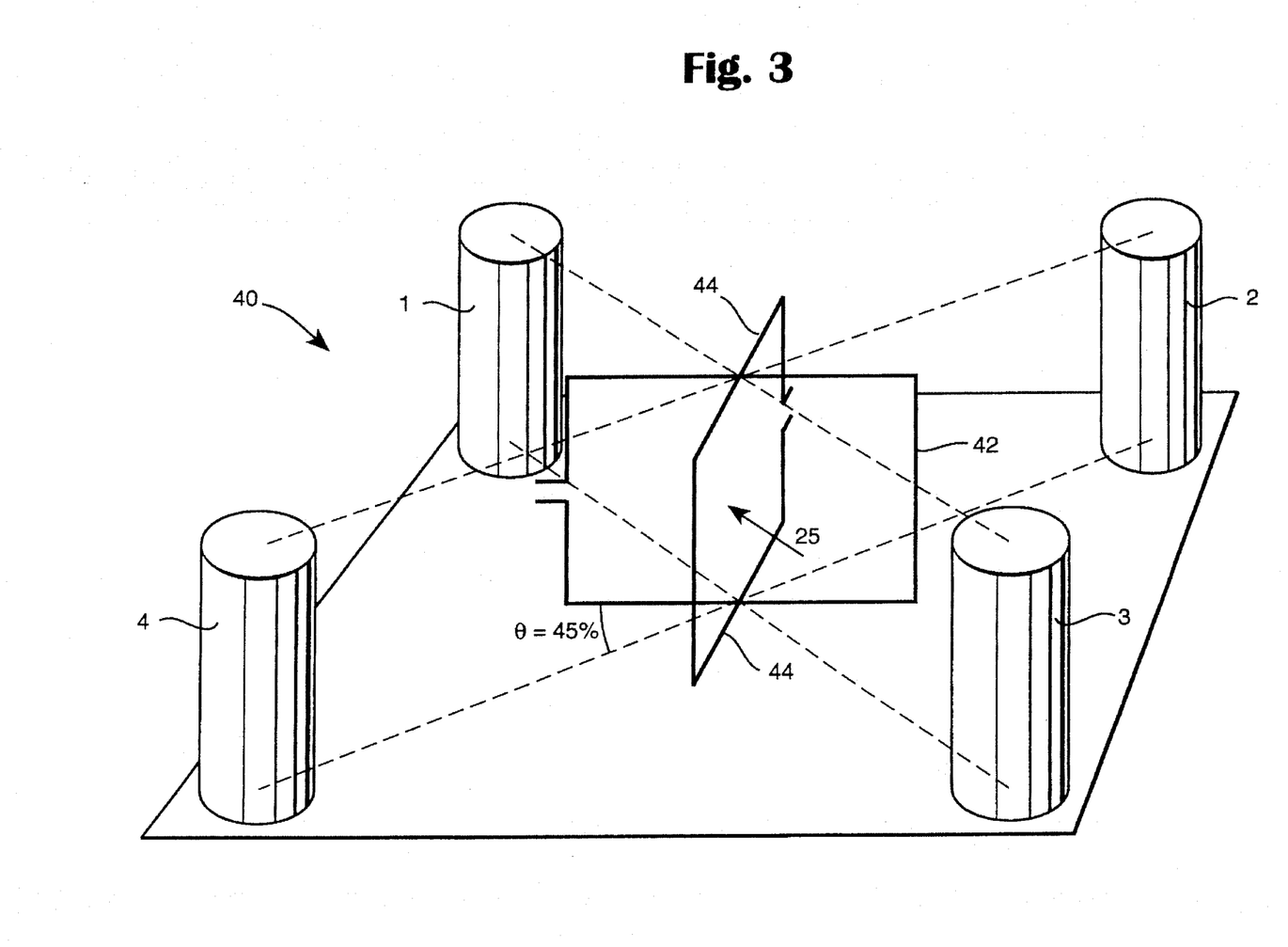
FIG. 3 is the X-wing transmission coil 45 degrees out of alignment with the four-post of the MRI system.

The inductive coupling that occurs between the loop 42 and the posts 2 and 4 in the position shown in FIGS. 2 and 2A during the above tests was demonstrated by rotating the loop forty five degrees to the position shown in FIG. 2B. Under the conditions shown in FIG. 2B, the coil Q improved to 223. While this coil Q value may be acceptable in certain MRI systems, rotating the coil 42 to the position shown in FIG. 2B defeats the purpose of improving access to the image volume 25 (FIG. 1) since the loop 42 interferes with the space created between the posts 2 and 3 and between posts 1 and 4. Similarly, if the loop 42 shown in FIG. 3 included the second loop 44 of the complete X-wing coils, the second loop would impede the access area between posts 3 and 4 and between posts 1 and 2 as well. Consequently, while the coil Q improves in the positions shown in FIGS. 2B and 3, these arrangements are disadvantageous since they reduce the access to the imaging volume 25.

The present invention permits the loops 42 and 44 to remain proximate to the posts 1–4 (as shown in FIG. 1) yet also improving the transmission coil Q to more respectable levels.

Figure 2C:
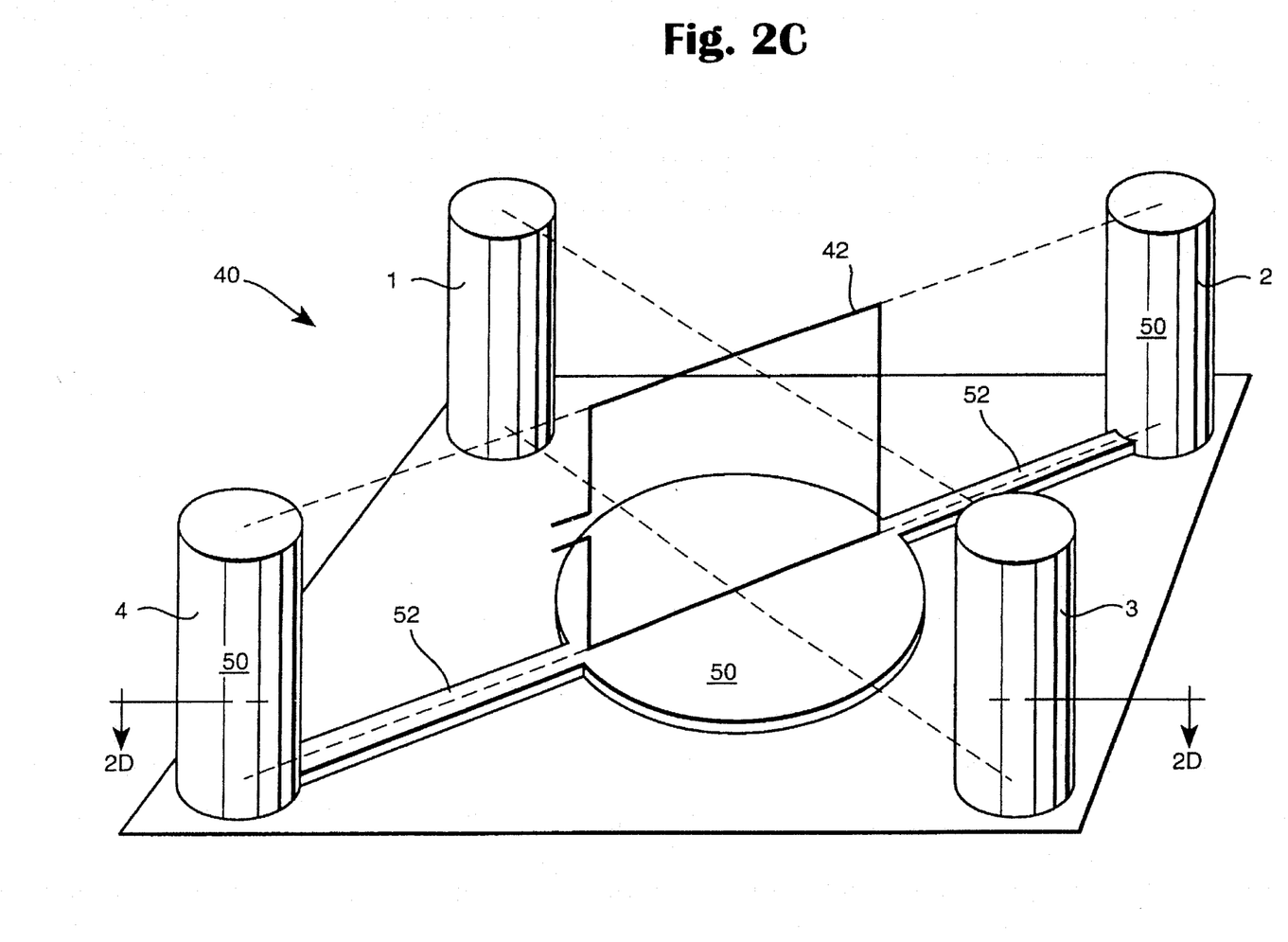
FIG. 2C is a schematic drawing of one loop of an X-wing coil arranged in alignment with four shielded posts of the MRI system.
Figure 2D:
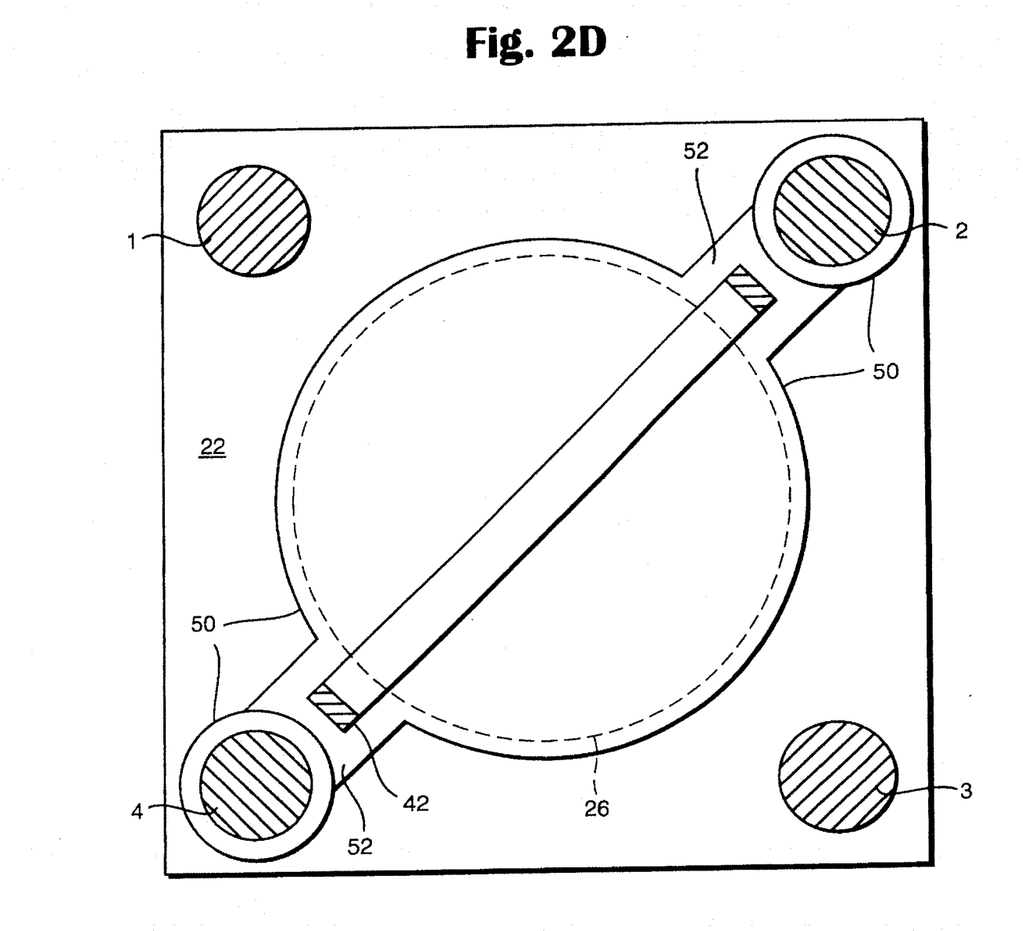
FIG. 2D is a cross-sectional view taken along the line 2D—2D in FIG. 2C.

One embodiment of the present invention is shown in FIGS. 2C and 2D, which correspond with the structures shown in FIGS. 2 and 2A, except that portions of the posts 2 and 4 and portions of the magnet pole pieces 24 and 26 are now shielded with aluminum foil sheets 50. Specifically, posts 2 and 4 are closely wrapped along at least the interior surface of the cylinders (with the seams overlapping) and are secured by conductive (copper) tape. Similarly, the portions of the magnet pole pieces 24 and 26 near the floor and ceiling of the imaging area 25 (also shown in FIG. 1) are also fully covered by aluminum. Finally, conductive (copper) strips 52 electrically connect the shielding 50 on the columns 2 and 4 to the shielding 50 on the upper and lower gradient coil magnet pole pieces 24 and 26.

As shown in FIGS. 2C and 2D, for purposes of the above tests, posts 2 and 4 were shielded, leaving posts 1 and 3 unshielded. By adding the shielding 50, the transmission coil Q for the coil 42 in the position shown in FIGS. 2C and 2D improved to 421. This coil Q compares with the coil Q of 35 that was measured before the RF shielding 50 was included on the MRI four-post system.

The results of the single loop tests are shown in the Table below:

| CONDITION | COIL Q |
| --- | --- |
| X-wing aligned with unshielded posts | 35 |
| X-wing 45 degrees off of unshielded posts | 223 |
| X-wing aligned with shielded posts, 1 & 3 | 421 |

As can be seen from these results, substantial improvements in the transmission coil Q can be realized by wrapping the four posts 1–4 and the pole pieces 24 and 26 with an RF reflective material, such as aluminum foil, copper foil, conductive metal screen or the like.

Figure 4:
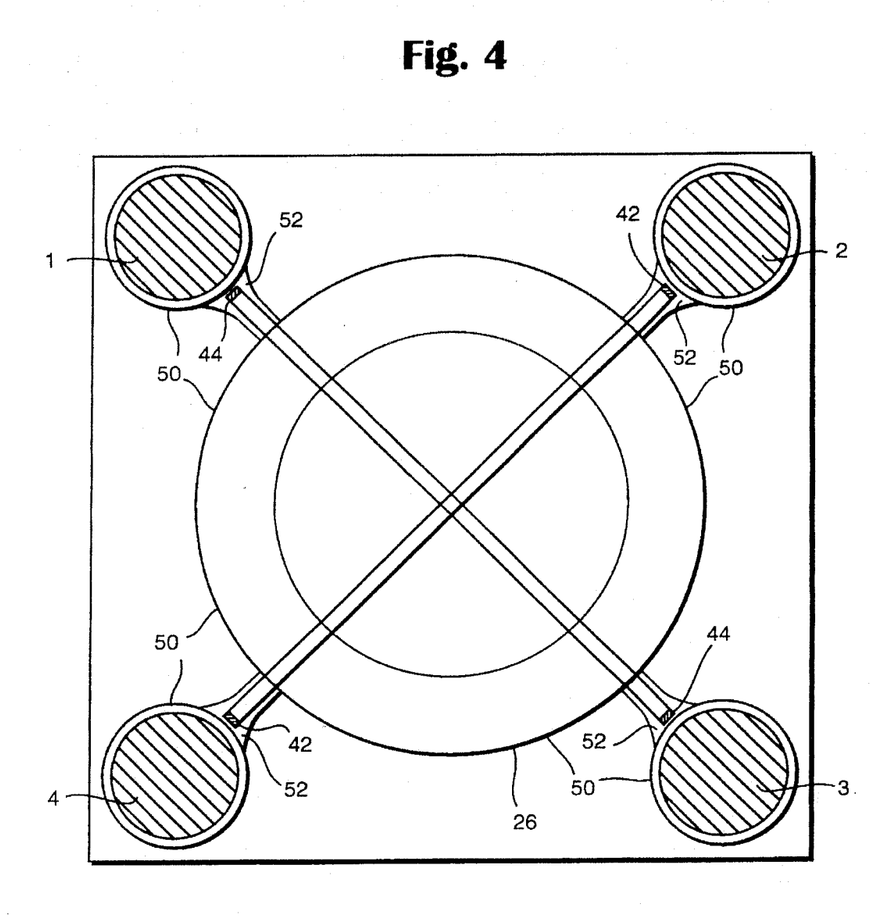
FIG. 4 is a cross-sectional view taken along the line 4—4 in FIG. 1.

Tests were also conducted with the full X-wing transmission coil (both loops) in the position shown in FIG. 4. That is, two loops, 42 and 44 of the X-wing coil 12 (FIG. 1) were arranged in alignment with the posts 1–4. The coil Q's were then measured under three conditions, without a detuning circuit, with a detuning circuit (Model UM-4001 PIN diodes) and with a D.C. router. The coil Q's were above acceptable values as follows:

| CHANNEL | Q |
| --- | --- |
| NO DETUNING CIRCUIT | |
| I | 365 |
| Q | 377 |
| WITH DETUNING CIRCUIT (UM-4001 PIN diodes used) | |
| I | 348 |
| Q | 351 |
| WITH D.C. ROUTER | |
| I | 344 |
| Q | 357 |

The coil Q uncertainty in the above tests is estimated to be between 2 and 3 percent. The above tests illustrate that clear and significant improvements can be made to the transmission coil quality factor when the posts 1–4, the upper and lower magnet pole pieces 24 and 26, and the static magnet structures 20 and 22 between the respective posts and the magnet pole pieces 24 and 26 are covered in a RF reflective shielding 50.

As can be seen in the embodiment of FIG. 4, which is a cross-sectional view of FIG. 1, the shielding 50 can be closely adhered to the posts 1–4 to follow the contours of the respective upper and lower magnet pole pieces 24 and 26.

Figure 5:
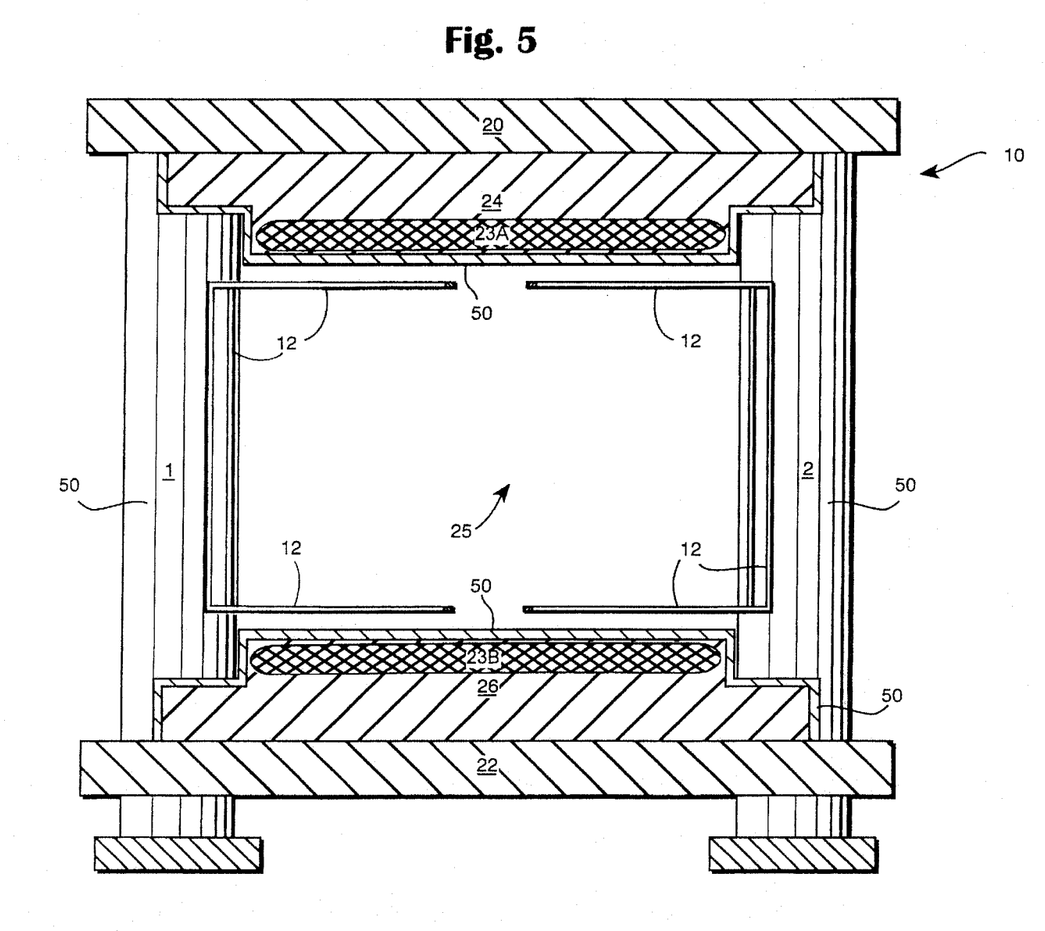
FIG. 5 is a longitudinal sectional looking in the direction of arrow B in FIG. 1.

FIG. 5 illustrates another cross-sectional view of FIG. 1 in o which the foil shielding 50 can be more particularly seen. As shown in FIG. 5, the upper and lower magnet pole pieces 24 and 26 are covered along their contours by the foil shielding 50. In addition, the posts 1–4 (only posts 1 and 2 can be seen in FIG. 5) are also covered in foil shielding 50 that electrically contacts the foil shielding 50 near the lower magnet pole pieces 24 and 26 by the strips 52 (FIG. 4). The X-wing coil 12 is positioned around the imaging volume 25 inside of the foil shielding 50 on the upper and lower magnet pole pieces 24 and 26 and the posts 1 and 2 (as well as posts 3 and 4 not shown in FIG. 5).

Figure 6:
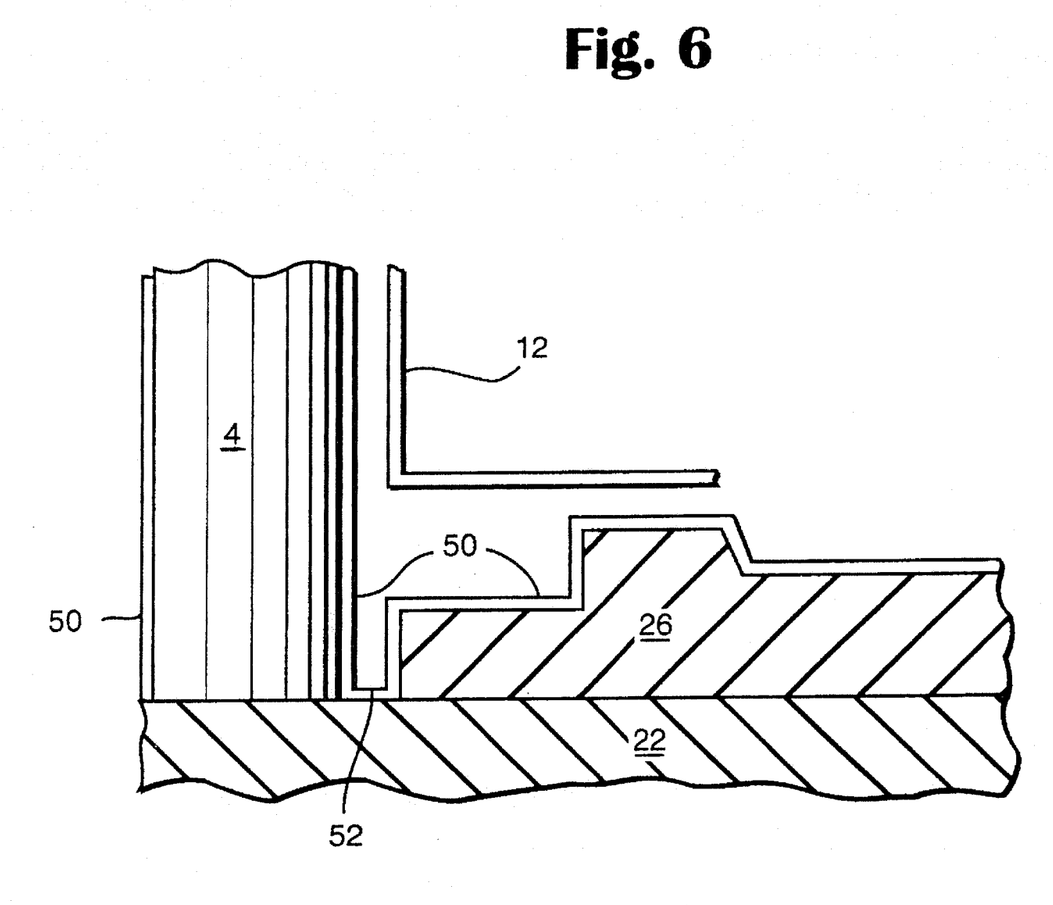
FIG. 6 is a fragmentary longituding sectional view looking in the direction of arrow D in FIG. 1.

FIG. 6 shows the foil continuity between the post (in this case post and the magnet pole piece (in this case the lower magnet pole piece 26). FIG. 6 is exemplary of each of the eight areas of FIG. 1 where the foil shielding 50 on the posts 1–4 crosses over to the upper magnet pole piece 24 or lower magnet pole piece 26. As shown in FIG. 6, the post 4 is wrapped in foil shielding 50, as is the lower magnet pole piece 26, along each of their respective contours. The X-wing coil 12 is positioned within the interior of the foil shielding covering the post 4 and the lower magnet pole piece 26. The foil shielding 50 on the post 4 and the foil shielding 50 on the lower magnet pole piece 26 are electrically contiguous via a strip 52 along a portion of the lower static magnet assembly 22.

In alternative embodiments, the posts 1–4 and the upper and lower magnet pole pieces can be covered with any highly electrically conductive (and RF reflective) material, such as aluminum, copper, etc. Also, the shielding can be applied to the posts and pole pieces in any known manner, such as taping it on, spraying it on, etc.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An MRI system, comprising:

upper and lower magnet structures;

at least two opposing posts supporting the upper and lower magnet structures;

the posts and magnet structures defining an imaging volume;

an RF transmission coil comprising at least one loop of conductive conduit arranged generally in a plane of the imaging volume defined by the two opposing posts; and an RF shield comprising a conductive material arranged in the imaging volume on the opposing posts between the opposing posts and the RF transmission coil.

2. An MRI system according to claim 1, wherein the RF shield is a conductive metal foil.

3. An MRI system according to claim 1, wherein the RF shield is arranged on the magnet structures.

4. An MRI system according to claim 1, wherein the upper and lower magnet structures each include a magnet pole piece and the RF shield is arranged on the magnet pole pieces.

5. An MRI system according to claim 1, wherein the upper and lower magnet structures each include a magnet pole piece and a static magnet assembly, and wherein the RF shield is electrically contiguous between the opposing posts, the magnet pole pieces and the static magnet assemblies.

6. An MRI system according to claim 1, further including:

two pairs of opposing posts supporting the upper and lower magnet structures;

two loops of conductive conduit comprising the RF transmission coil, one loop of conductive conduit arranged generally in a plane of the imaging volume defined by a first of the two pairs of opposing posts, and the other loop of conductive conduit arranged generally in a plane of the imaging volume defined by the other of the two pairs of opposing posts; and the RF shield comprising a conductive material arranged in the imaging volume on the pairs of opposing posts between the opposing posts and the RF transmission coil.

7. An MRI system according to claim 6, wherein the RF shield is a conductive metal foil.

8. An MRI system according to claim 6, wherein the RF shield is arranged on the magnet structures.

9. An MRI system according to claim 6, wherein the upper and lower magnet structures each include a magnet pole piece, and the RF shield is arranged on the magnet pole pieces.

10. An MRI system according to claim 6, wherein the upper and lower magnet structures each include a magnet pole piece and a static magnet assembly, and wherein the RF shield is electrically contiguous between the opposing posts, the magnet pole pieces and the static magnet assemblies.

\* \* \* \* \*